US008304295B2

(12) United States Patent
Goh et al.

(10) Patent No.: US 8,304,295 B2
(45) Date of Patent: Nov. 6, 2012

(54) METHOD OF MANUFACTURING AN ELECTRONIC DEVICE WITH A PACKAGE LOCKING SYSTEM

(75) Inventors: Soon Lock Goh, Melaka (MY); Swee Kah Lee, Melaka (MY); Chin Wei Ronnie Tan, Pulau Pinang (MY)

(73) Assignee: Infineon Technologies AG, Neubiberg (DE)

( * ) Notice: Subject to any disclaimer, the term of this patent is extended or adjusted under 35 U.S.C. 154(b) by 184 days.

(21) Appl. No.: 12/820,821

(22) Filed: Jun. 22, 2010

(65) Prior Publication Data

US 2011/0309493 A1 Dec. 22, 2011

(51) Int. Cl.
*H01L 21/00* (2006.01)

(52) U.S. Cl. .................... 438/124; 257/737

(58) Field of Classification Search .......... 438/124; 257/737, E21.508, E23.068
See application file for complete search history.

(56) References Cited

U.S. PATENT DOCUMENTS

| 5,329,158 | A  | * | 7/1994 | Lin ..................... 257/666 |
| 6,539,624 | B1 |   | 4/2003 | Kung et al. |
| 6,861,295 | B2 |   | 3/2005 | Jung et al. |
| 7,579,676 | B2 |   | 8/2009 | Lin |
| 2010/0129964 | A1 | * | 5/2010 | Goh et al. ............. 438/124 |

* cited by examiner

*Primary Examiner* — Phuc Dang
(74) *Attorney, Agent, or Firm* — Slater & Matsil, L.L.P.

(57) ABSTRACT

Device and method for an electronic device package is disclosed. The electronic device package includes a first pad, a second pad and an encapsulation surrounding the first and second pad, wherein the encapsulation includes a first opening underneath the first pad and a second opening underneath the second pad. A first bump is arranged in the first opening and a second bump is arranged in the second opening, wherein the encapsulation mechanically locks the first bump to the first pad and the second bump to the second pad.

20 Claims, 3 Drawing Sheets

METHOD OF MANUFACTURING AN ELECTRONIC DEVICE WITH A PACKAGE LOCKING SYSTEM

BACKGROUND

The invention relates to an electronic device having connecting elements and a method for producing the same.

Surface mounted technology is a technology for mounting electronic devices directly onto the surface of a printed circuit board (PCB). The surface mounted technology has largely replaced the through-hole technology of fitting electronic devices with wire leads into holes in the printed circuit board (PCB).

A surface mounted device is usually smaller than its through-hole counterpart because it has either smaller leads or no leads at all. Surface mounted device may have short pins or leads of various styles, flat contacts, a matrix of solder balls such as a Ball Grid Array (BGA), or terminations on the body.

One type of a surface mounted device comprises a semiconductor device which is mounted on a metallic support (carrier) or lead-frame. The semiconductor device contacts are electrically connected to the lead-frame using bond wires. The backside of the semiconductor device may also be connected to the lead-frame. After connecting the semiconductor device to the lead-frame, the system is encapsulated with a molding compound. Some surface mounted device packages, such as TSLP (thin small leadless package) have metallic supports which are all on one side of the package. Other surface mounted device packages, such as TSFP (thin small flat package) or SOT (small outline transistor), have metallic supports which stand out laterally in a flat or bended manner from the package or the sealing mass. The metallic supports are thermally and electrically connected to the associated conductive lines of the circuit board via soldering.

SUMMARY OF THE INVENTION

In accordance with a preferred embodiment of the present invention, an electronic device package comprises a first pad, a second pad and an encapsulation surrounding the first and second pad, wherein the encapsulation includes a first opening underneath the first pad and a second opening underneath the second pad. The electronic device package further comprises a first bump arranged in the first opening and a second bump arranged in the second opening, wherein the encapsulation mechanically locks the first bump to the first pad and the second bump to the second pad.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an electronic device package. The invention may also be applied, however, to other packaging technologies.

Figure 1:
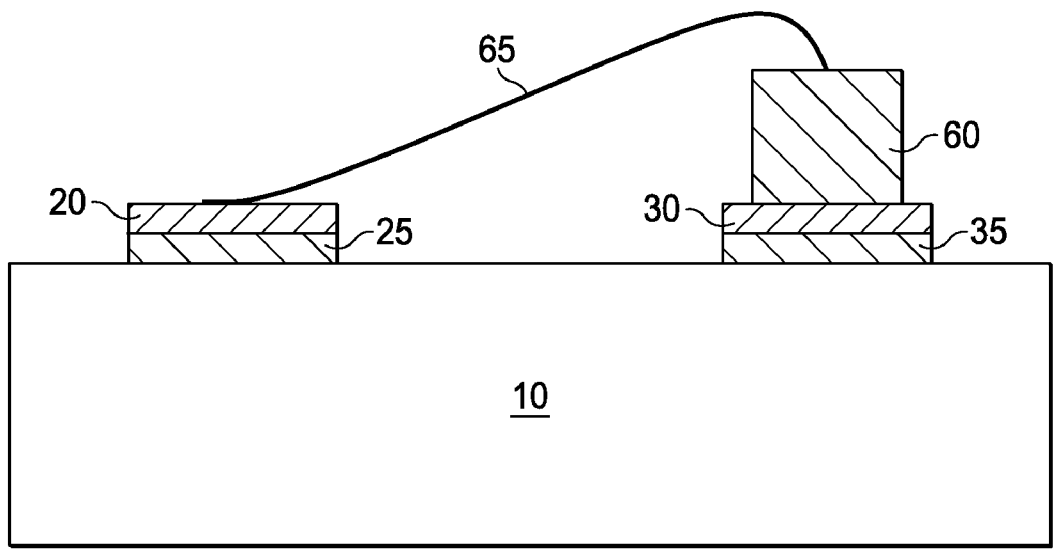
FIG. 1 illustrates a cross-sectional view of a conventional lead-frame.

FIG. 1 shows a conventional carrier 10, typically a copper (Cu) lead-frame, with a silver (Ag) wire bond pad 20 disposed on top of a first nickel (Ni) bump 25 and a silver (Ag) die bond pad 30 disposed on top of a second nickel (Ni) bump 35. A die 60 is typically disposed on the die bond pad 30 and electrically connected to the wire bond pad 20 via a bond wire 65.

The nickel (Ni) bumps 25, 35 are typically formed on the carrier 10 by a plating technology. Plating the nickel (Ni) bumps 25, 35 on the carrier 10 generally requires many complex processing steps which increases cycle time and cost. Several raw materials and a variety of machines may be used which further increases the cost.

In one embodiment of the present invention solder bumps are formed directly on the bond pads without the formation of nickel (Ni) bumps. In one embodiment of the invention, solder bumps are formed directly adjacent to the bond pads. In another embodiment, solder bumps are formed abutting the bond pads.

In another embodiment the solder bumps are formed underneath the bond pads wherein extensions of the encapsulation provide mechanical support for the solder bumps. In yet another embodiment the extensions of the encapsulation lock the solder bumps to the bond pads. In one embodiment the solder balls comprise a groove, a notch, a recess or an indention. Alternatively, the solder balls comprise a diameter in a middle region which is smaller than a diameter in an upper region and a lower region. The extensions of the encapsulation extend into the groove, notch, recess, indention or the smaller diameter of the middle region. In yet another embodiment the grove, the notch, the recess or the indention of the solder bump approximates a bottleneck or a recess of an hour-glass.

In one embodiment bond pads are formed on the carrier or lead-frame. The carrier or lead-frame comprises a different material than the bond pad. The bond pad may comprise a thin noble metal such as silver (Ag) or gold (Au). In one embodiment the carrier or lead-frame is partially etched away removing about half of the thickness of the carrier material, forming gaps underneath a portion of the bonding pads. At that point, the bond pads are connected to the carrier or lead-frame by an elevated carrier or lead-frame structure which has not been etched away.

A molding compound may be used to encapsulate the bond pads. In one embodiment the molding compound flows into gaps underneath the bond pads completely filling these gaps and forming the encapsulation. The carrier or lead-frame will be etched off leaving empty gaps or openings underneath the bond pads and exposing the bond pads. The empty gaps or openings may be filled with solder paste during solder printing. Solder bumps may be formed after reflow finalizing the electronic device package. When mounted on the printed circuit board (PCB), the solder bumps form a mechanical and electrical bridge from the electronic device package to the printed circuit board (PCB).

Embodiments of the present invention provide many advantages including an integrated electronic device package with a solid locking system that prevents pad drop offs. Other advantages include an easier and more cost efficient manufacturing process.

Figure 2:
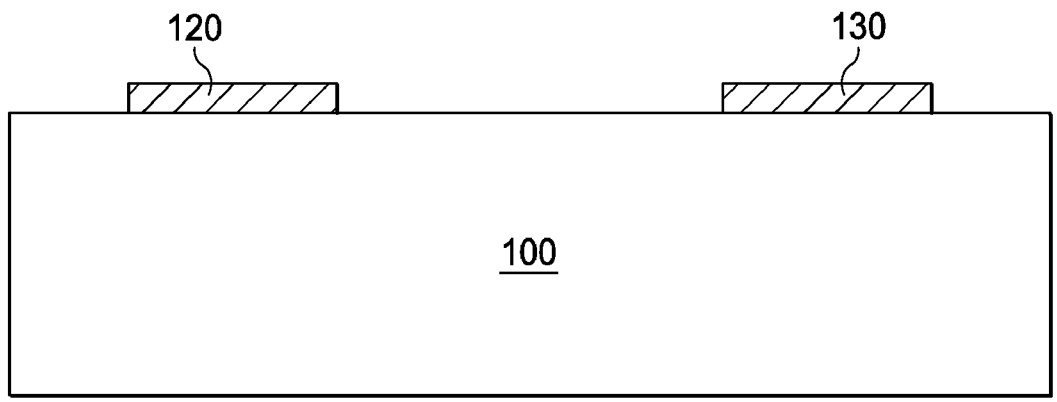
FIG. 2 illustrates a cross-sectional view of a carrier with pads.

FIGS. 2-7 show an embodiment of a process flow forming an electronic device package. The wire bond pad 120 and the die bond pad 130 may be disposed directly on the carrier 100 as illustrated in FIG. 2. The wire bond pad 120 and the die bond pad 130 may be formed by forming a layer of noble metal on the carrier 100. The bond pads 120, 130 may comprise silver (Ag) or gold (Au) but other materials may be Palladium (Pd), Copper (Cu), or Aluminum (Al). The wire bond pad 120 and the die bond pad 130 may be about 1-4 µm or about 1.5-3 µm thick. Alternatively, they are about 2 µm thick.

An additional noble metal layer comprising Copper (Cu), Palladium (Pd) or gold (Au) flash may optionally placed underneath the bond pads 120, 130 or between the bond pads 120, 130 and the carrier 100. The additional metal layer may increase the adhesion of the solder to the bond pads 120, 130. The layers of noble materials may be formed by electroless plating, electrolytic plating or sputtering.

A photoresist may be deposited on the layer of noble metal (not shown). Conventional lithography techniques are applied to structure the photoresist. The photoresist is then removed from areas outside of the regions where the bond pads 120, 130 will be formed by applying a conventional etch chemistry. The etch process may remove the noble metal from the areas where the pads 120, 130 will not be formed.

Figure 3:
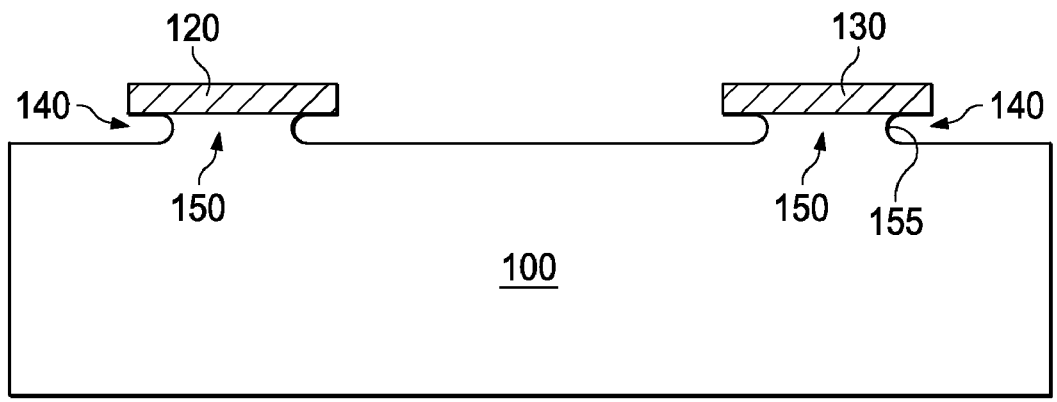
FIG. 3 illustrates a cross-sectional view of a carrier with under etched pads.

After the pads 120, 130 are formed the carrier 100 may be etched. The material of carrier 100 may be copper (Cu) or Iron (Fe). An isotropic wet etch is applied to the carrier 100 thereby removing the upper surface of the carrier 100. The isotropic wet etch may be selective regarding the bond pads 120, 130, that is, the isotropic wet etch removes material of the carrier 100 but not the material of the bond pads 120, 130. In one embodiment the isotropic wet etch vertically removes about 15 µm to 30 µm, or, alternatively, about half of the material thickness of the carrier 100. In one embodiment the isotropic wet etch vertically removes about 20 µm to about 25 µm. In one embodiment the isotropic wet etch also removes material of the carrier underneath the pads 120, 130 forming under-etch openings 140. The isotropic wet etch process removes horizontally about 5 µm an to about 15 µm, or alternatively, about 10 µm. After the etch process is completed, the photoresist may be removed over the bond pad regions 120, 130. This is shown in FIG. 3.

In one embodiment the carrier 100 may be etched by a wet acid etch process, or alternatively by a dry etch process such as plasma etching. In one embodiment, a wet etch chemistry for the removal of copper (Cu) may be ammonia chloride and a wet etch chemistry for the removal of Iron (Fe) may be a ferric chloride together with a citric acid.

In one embodiment the remaining elevated structure 150 of the carrier 100 underneath the bond pads 120, 130 which was not etched away may form a cylinder with a circular base. In another embodiment the elevated structure 150 may form a cylinder with an oval base. In yet another embodiment the elevated structure may form a cylinder having a base of any other round shape. In one embodiment, the sidewalls 155 of the elevated structure 150 may have a rounded shape or, alternatively, a straight shape. In another embodiment, the sidewalls 155 of the elevated structure 150 may have a concave shape. The height of the sidewalls of the cylinder may be about 5 to 10 µm, about 7 to 10 µm, about 5 to 8 µm, or alternatively, about 6 µm.

Figure 4:
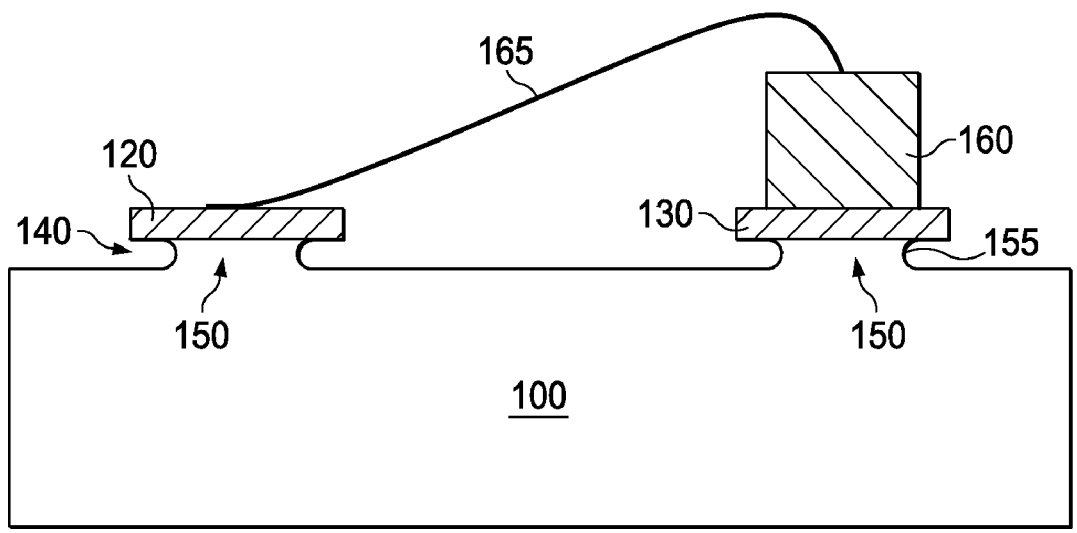
FIG. 4 illustrates a cross-sectional view of a die wire-bonded to a pad.

As illustrated in FIG. 4, in one embodiment an IC die 160 is attached to the die bond pad 130 by dispensing a layer of epoxy adhesive onto the upper surface of the die bond pad 130 and attaching the IC die 160 to the epoxy adhesive layer. Following the attachment of the IC die 160 to the epoxy glue layer, the epoxy adhesive may be cured with a temperature of about 150° C. for about 30 min to about 90 min, for example. In another embodiment, the IC die 160 may be attached to the die pad 130 by eutectic bonding with a temperature budget of up to about 320° C. The backside of the IC die 160 is melted and attached to the die bond pad 130.

In one embodiment the IC die 160 may be an integrated circuit comprising a processing unit or a memory unit or a combination of a processing unit and a memory unit. In another embodiment the IC die 160 may be a discrete semiconductor component such as a single transistor.

The IC die 160 is wire-bonded to the wire bond pad 120 by a wire 165. In one embodiment, a ball may be formed at the end of the wire 165 and the ball may be attached to the IC die 160 using heat, pressure and ultrasonic energy. In one embodiment, the wire 165 is directly attached to the wire bond pad 120 without forming a ball. The wire bond between the wire 165 and the wire bond pad 120 is typically referred to as wedge bond or tail bond.

Figure 5:
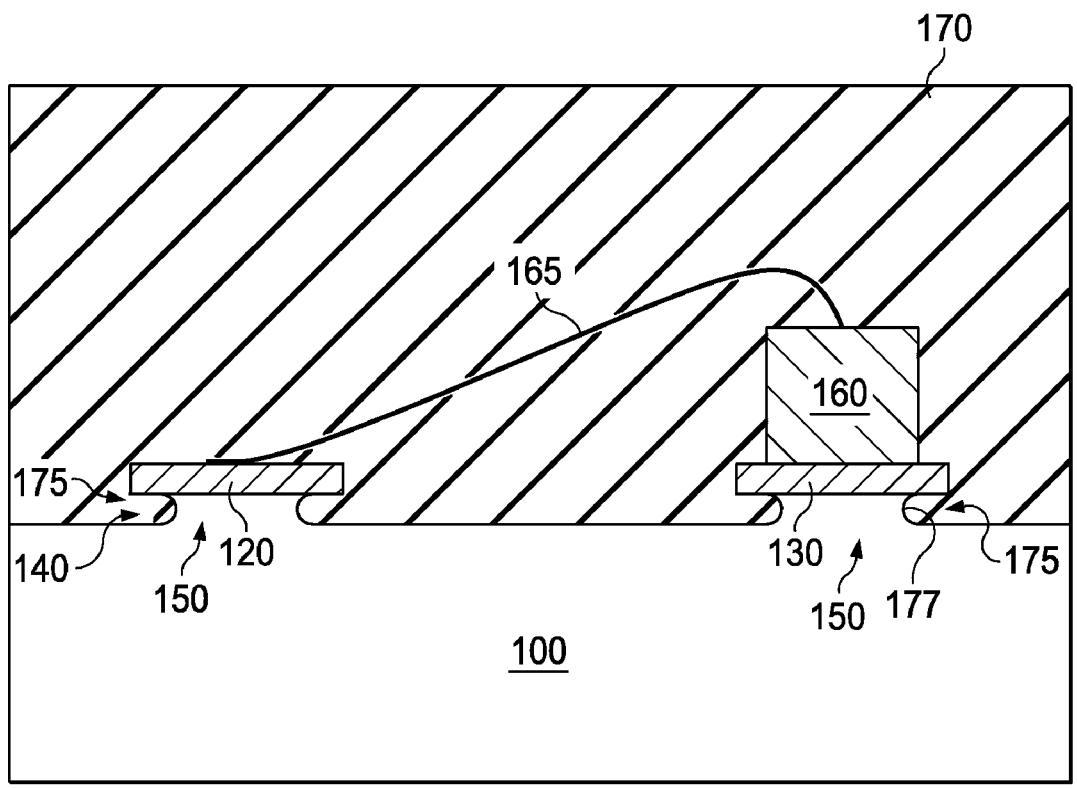
FIG. 5 illustrate a cross-sectional view of an encapsulated die arrangement over the carrier.

FIG. 5 shows an encapsulation or body 170 of the bond pads 120, 130, the IC die 160 and the wire bond 165 using a molding compound disposed over the carrier 100. The molding compound may be melted and flown into a molding case at about 160° C. to about 185° C. and may be cured afterwards. The encapsulation or body 170 may be formed by a transfer molding process, or alternatively, by an injection molding process.

In one embodiment, the encapsulation ob body 170 may completely surround the bond pad 120, 130 and the molding compound may completely fill the under-etch openings 140. The molding compound may form extensions 175 underneath the bond pads 120, 130 having rounded tips 177. In one embodiment the tips 177 of the extensions 175 may form a complement to the sidewalls 155 of the elevated structure 150. The tips 177 of the extensions 175 may be an imprint of the sidewalls 155 of the elevated structure 150. In another embodiment the extensions 175 may comprise convex tips 177.

The molding compound may be selected from a material which has good flow fill properties and yet has strength enough to form sufficiently strong and reliable extensions 175 in the under-etch opening 140. In one embodiment the molding compound comprises a thermoset plastic and silica filler. In another embodiment the molding compound comprises an epoxy based resin such as a multi aromatic or a multifunctional epoxy resin. The epoxy based resin may be epoxy cresol novolac or ortho cresol novolac.

The body or the encapsulation 170 may comprise an electrically insulating or a non-conductive material. The body or the encapsulation 170 may be a dielectric encapsulant. The body or the encapsulation 170 may be about 0.05 mm to about 0.30 m thick. Alternatively, the body or the encapsulation 170 may be about 0.20 mm to about 0.25 mm thick or about 0.08 mm to about 0.12 mm thick.

Figure 6:
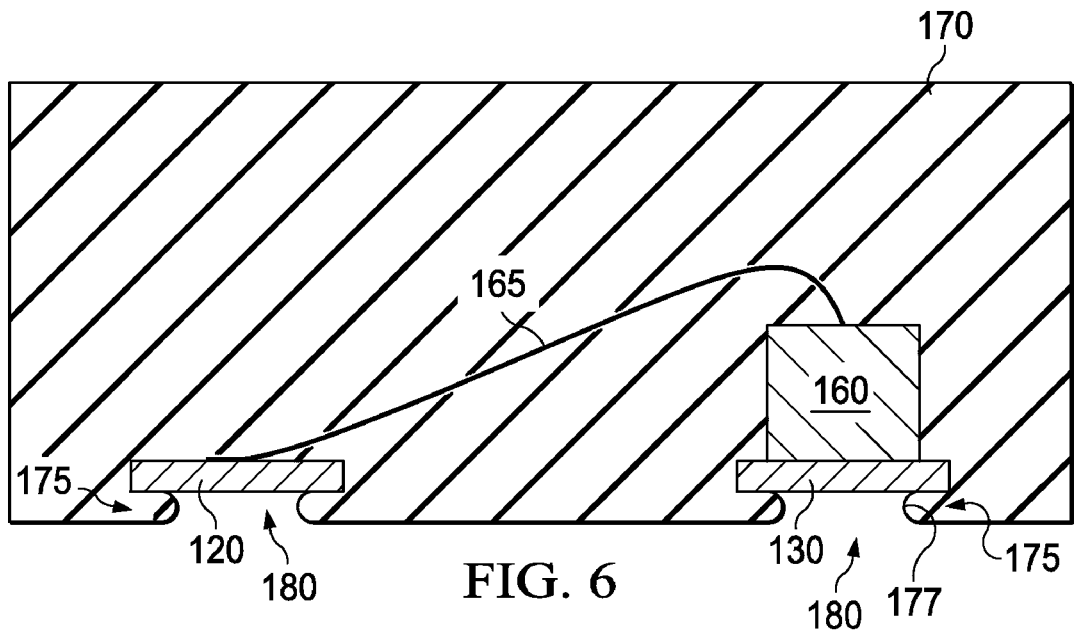
FIG. 6 illustrates a cross-sectional view of the encapsulated die arrangement with a removed carrier.
Figure 7:
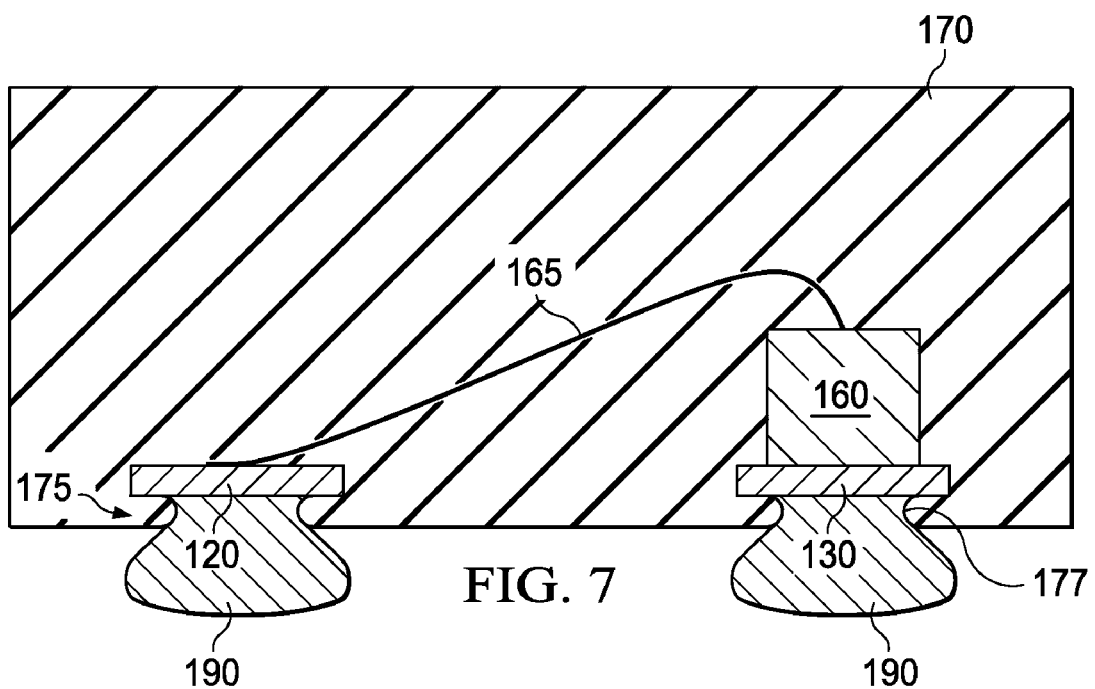
FIG. 7 illustrates a cross-sectional view of the encapsulated die arrangement with solder bumps arranged at the pads.

In FIG. 6, the carrier 100 may be removed from the encapsulation 170 by a wet etch process leaving an empty space or opening 180 underneath the bond pads 120, 130. The lower surface of the bond pads 120, 130 are now exposed by the opening 180. In one embodiment the opening 180 underneath the bond pads 120, 130 may comprise a similar shape or a same shape as the elevated structure 150. In another embodiment the opening 180 may comprise different shapes from the elevated structure 150. The opening 180 may comprise sidewalls 155 with concave roundings.

In one embodiment the carrier 100 may be removed from the encapsulation 170 by a wet acid etch process, or alternatively by a dry etch process such as plasma etching. In one embodiment, a typical wet etch chemistry for the removal of copper (Cu) may be ammonia chloride and a typical wet etch chemistry for the removal of Iron (Fe) may be a ferric chloride together with a citric acid.

In one embodiment a solder paste is used to form conductive solder bumps 190 in the openings 180 under the exposed bond pads 120, 130. The solder paste may comprise a material with good viscosity and slump. The solder paste typically comprises a tin or lead component, such as Sn—Pb. Alternatively, SAC alloys (Sn/Ag/Cu) or Sn-antimony (Sn/Sb) alloys may be used.

The solder bumps 190 further protect and stabilize the bond pads 120, 130 and fill the under-etch opening 180. The solder bumps 190 may be formed using a solder paste printing process and a reflow process. The solder paste may be pressed and forced into the edges of the under-etch opening 180 forming a consistent uniform and void free solder bump 190. After cooling, the solder bumps 190 form a mechanically robust and reliable lock with the encapsulation 170 covering and protecting the bond pads 120, 130. The solder bumps 190 may lock and integrate the bond pads 120, 130 to the encapsulation 170 so that a bond pad drop off may be prevented.

The solder bumps 190 may comprise an upper region, a middle region and a lower region. In one embodiment, the solder bump 190 comprises a 3-dimensional form wherein the middle region comprises a smaller diameter than a diameter of the lower region and a diameter of the upper region. In one embodiment the solder bump 190 may comprise a first region and a second region. The first region, which is the region abutting the bond pads 120, 130, may comprise a shape of a cylinder having a concave cylinder barrel, and the second region, which is the region outside the encapsulation layer, may comprise a partially spherical sector which is larger than a hemispherical sector. In yet another embodiment, the solder bump comprises a groove, a notch, a recess or an indention.

In one embodiment, the convex shape of the tips 177 of the extensions 175 provides a mechanical support structure for the solder bumps 190 so that the solder bumps 190 are locked into the opening 180. In another embodiment the tip 177 of the extensions 175 may extend at the middle region of the solder bump 190 having the smaller diameter or may abut the concave cylinder barrel of the first region of the solder bumps 190. In yet another embodiment the tip 177 of the extensions 175 may extend into the groove, the notch, the recess or the indention of the solder bump 190. In one embodiment, the solder bumps 190 may comprise a spherical shape outside the encapsulation 170.

Although the present invention and its advantages have been described in detail, it should be understood that various changes, substitutions and alterations can be made herein without departing from the spirit and scope of the invention as defined by the appended claims. For example, the shape of the solder bump may comprise any 3-dimensional form as long as it comprises a grooving or a notch so that the solder bump provides a locking mechanism for the bond pads. The shape of the solder bump will be within the spirit and the scope of the invention as long as the bond pads 120, 130 can be "locked" by the solder bumps 190 having a larger diameter directly underneath the bond pads 120, 130 than at the opening of the encapsulation surface underneath the bond pads 120, 130.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing an electronic device package, the method comprising:
    forming a first pad and a second pad on a carrier;
    partially removing the carrier underneath the first and the second pads;
    disposing a body around the first and the second pads and on the carrier;
    removing the carrier from the body and the first and second pads thereby partially exposing the first and the second pads; and
    forming a first bump on the first exposed pad and a second bump on the second exposed pad.

2. The method according to claim 1, further comprising:
    after partially removing the carrier, placing an electronic device onto the first pad; and
    electrically connecting the electronic device to the second pad.

3. The method according to claim 1, wherein forming the first and the second pads on the carrier comprises forming the first and second pads directly on the carrier.

4. The method according to claim 1, wherein the first and second pads comprise a noble metal.

5. The method according to claim 4, wherein the first and second pads comprise gold (Au) or silver (Ag).

6. The method according to claim 1, wherein forming the first and second bumps comprises mechanically locking the first and second bumps between the body and the first and second pads.

7. The method according to claim 6, wherein the first and second bumps comprise a groove, a notch, a recess or an indention and wherein the body extends into the groove, the notch, the recess or the indention thereby mechanically locking the first bump to the first pad and the second bump to the second pad.

8. The method according to claim 2, wherein the electronic device comprises an integrated circuit device or a single transistor.

9. The method according to claim 1, wherein the body comprises an epoxy based resin.

10. A method for manufacturing an electronic device package, the method comprising:
    forming a first pad and a second pad on a carrier;
    isotropically etching thereby removing portions of the carrier underneath the first and second pads;
    forming a body over the carrier and the first and second pads;

removing the carrier from the body and the first and second pads thereby forming a first opening underneath the first pad and a second opening underneath the second pad; and filling the first opening with a conductive solder material and filling the second opening with the conductive solder material, the conductive solder material extending outside the first opening and the second opening and overlying a portion of a bottom surface of the body.

11. The method according to claim 10, further comprising:

after isotropically etching the carrier, placing an electronic device onto the first pad; and electrically connecting the electronic device to the second pad.

12. The method according to claim 10, wherein the first and second pads are a single layer of gold (Au), silver (Ag), copper (Cu), palladium (Pd) or aluminum (Al).

13. The method according to claim 12, wherein filling the first opening with the conductive solder material and filling the second opening with the conductive solder material comprises mechanically locking the solder material between the body and the first and second pads.

14. The method according to claim 13, wherein the conductive solder material comprises a solder paste and wherein the solder paste comprises Sn/Ag/Cu alloy or Sn/Sb alloy.

15. A method for manufacturing an electronic device package, the method comprising:

forming a first pad and a second pad on a carrier, wherein the first pad and the second pad is a single layer of a noble material;

partially removing the carrier underneath the first pad and the second pad;

forming a body over the carrier, the first pad and the second pad;

removing the carrier from the body and the first pad and second pad thereby partially exposing the first pad and the second pad;

forming a first bump on the noble material of the first pad; and forming a second bump on the noble material of the second pad.

16. The method according to claim 15, further comprising:

after partially removing the carrier, placing an electronic device onto the first pad; and electrically connecting the electronic device to the second pad.

17. The method according to claim 15, wherein forming the first and second pads on the carrier comprises forming the first and second pads directly on the carrier.

18. The method according to claim 15, wherein the noble material comprises gold (Au), silver (Ag), copper (Cu), palladium (Pd) or aluminum (Al).

19. The method according to claim 15, wherein forming the first and second bumps comprises mechanically locking the first and second bumps between the body and the first and second pads.

20. The method according to claim 15, wherein the first and second bumps comprise a solder paste, the solder paste comprising Sn/Ag/Cu alloy or Sn/Sb alloy.

* * * * *